United States Patent [19]

Meulenberg, Jr.

[11] 4,053,327

[45] Oct. 11, 1977

[54] LIGHT CONCENTRATING SOLAR CELL COVER

[75] Inventor: Andrew Meulenberg, Jr., Gaithersburg, Md.

[73] Assignee: Communications Satellite Corporation, Washington, D.C.

[21] Appl. No.: 616,468

[22] Filed: Sept. 24, 1975

[51] Int. Cl.² .............................................. H01L 31/06
[52] U.S. Cl. ............................ 136/89 CC; 136/89 PC
[58] Field of Search .......... 136/89; 250/211 R, 211 J, 250/212, 216, 239

[56] References Cited

U.S. PATENT DOCUMENTS

| | | | |
|---|---|---|---|
| 2,137,466 | 11/1938 | Tonnies | 88/23 |
| 2,904,612 | 9/1959 | Regnier | 136/89 |
| 3,018,313 | 1/1962 | Gattone | 136/89 |
| 3,150,999 | 9/1964 | Rudenberg et al. | 136/89 |
| 3,589,946 | 6/1971 | Tarneja et al. | 136/89 |
| 3,912,540 | 10/1975 | Broder | 136/89 |
| 3,971,672 | 7/1976 | Lampkin | 136/89 |

FOREIGN PATENT DOCUMENTS

| | | | |
|---|---|---|---|
| 751,084 | 1/1967 | Canada | 136/89 |

Primary Examiner—John H. Mack
Assistant Examiner—Aaron Weisstuch
Attorney, Agent, or Firm—Sughrue, Rothwell, Mion, Zinn and Macpeak

[57] ABSTRACT

A cover slide for a solar cell comprises a plurality of converging lenses arranged to focus the incident light so that it does not fall on the grid lines of the front electrode of the solar cell.

5 Claims, 2 Drawing Figures

LIGHT CONCENTRATING SOLAR CELL COVER

BACKGROUND OF THE INVENTION

1. Field of the Invention

The present invention generally relates to solar cells, and more particularly to a light concentrator designed to collect the light that would normally be reflected or fall on the front electrode grid lines and redirect it into the solar cell to thereby increase the efficiency of the cell.

2. Description of the Prior Art:

Conventional solar cells have a top surface which is partially covered by thin grid lines. These grid lines as a whole comprise the top or front electrode of the solar cell. At a minimum, the grid lines are arranged to cover only 6% of the surface, but even with that small coverage, they will block 6% of the light from entering into the solar cell and becoming useful, i.e. being converted into electrical current. If a light concentrator were designed to collect the light that would normally fall on the grid lines and redirect it into the cell, at least a 6% increase in the output of the solar cell could be attained. Conventional solar cell coverslides have flat, smooth, surfaces with an antireflection coating on top. In spite of this antireflecting layer, about 3% of the useful light is lost to the cell by reflection from the coverslide. The light concentrator design can be chosen so as to reduce this reflection loss to almost zero. The net increase of the light concentrator on a solar cell would therefore be at least 9% and more likely close to 12%.

SUMMARY OF THE INVENTION

The present invention solves the problem of light blocked by the grid lines on the surface of a solar cell by providing a lens arrangement which is placed above or directly on top of the solar cell. The lens arrangement takes the form of a plurality of converging lenses which concentrate the light. In one embodiment, a plurality of hemi-cylinders are used, while in another embodiment the cover slide is grooved to form a plurality of sawtooth ridges. Modifications of each of these embodiments include a "waffle" lens where each lens element is generally hemispherical in shape but generated from a square base, and a pyramidal surface created by two sets of perpendicular grooves.

The light concentrator according to the invention increases the output of the solar cell in a number of ways. First, all of the incident light is directed into the solar cell, rather than reflected from the grids or coverslide front surface. Second, with the use of the light concentrator, more grids could be used, reducing surface resistance so that the increased current from the more intense light would not introduce greater power loss than normally encountered. Moreover, the grids could be wider to increase their conductivity. Third, the increased light injection level improves the open circuit voltage and the "fill factor" if the solar cell junction is not ideal. Fourth, in the "waffle" lens and pyramidal lens modifications, cross-connecting grids can be employed to thereby increase reliability and decrease the distance carriers have to travel in the surface region.

BRIEF DESCRIPTION OF THE DRAWING

The specific nature of the invention, as well as other objects, aspects, uses and advantages thereof, will clearly appear from the following description and from the accompanying drawing, in which.

DESCRIPTION OF THE PREFERRED EMBODIMENTS

Figure 1:
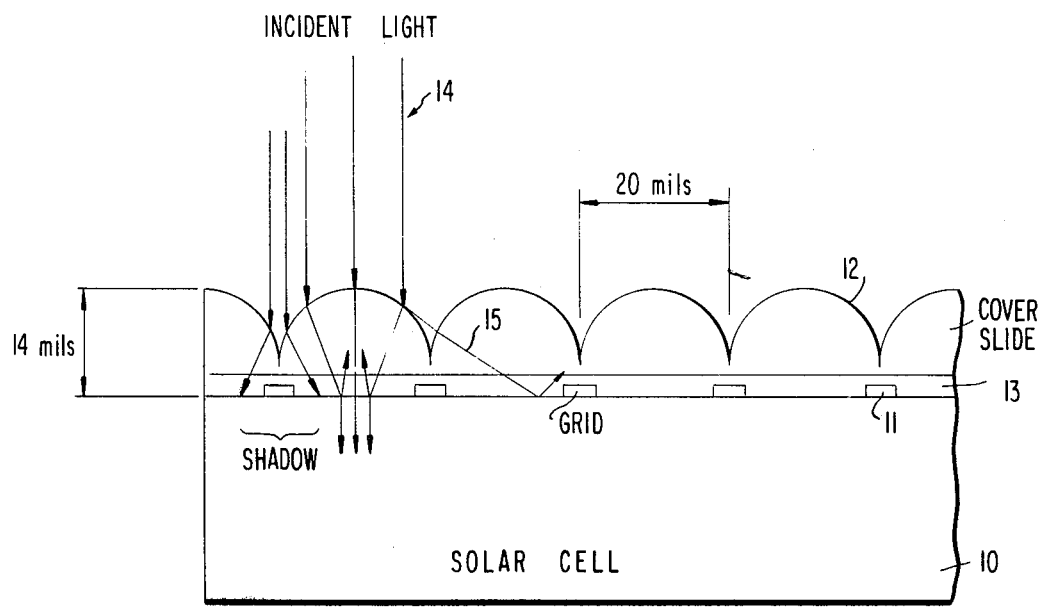
FIG. 1 is a cross-sectional view showing a first embodiment of the light concentrating solar cell cover according to the invention placed directly on top of a solar cell.

FIG. 1 illustrates in cross section a conventional solar cell 10 having a plurality of grid lines 11 forming the top electrode on the top surface of the solar cell. The cover slide 12 according to the first embodiment of the invention is in the form of a lens arrangement comprising a plurality of hemi-cylinders. As illustrated in the Figure, the diameter of the hemi-cyclinders is equal to the repeat period of the grid lines 11. The cover slide 12 could be extruded in plastic or glass (for examples) for terrestrial use or formed in fused silica, quartz, or sapphire for space applications. The cover slide may be supported above the solar cell, attached directly to the top surface thereof with a suitable adhesive 13, or integrally bonded directly to the top surface thereof.

The hemi-cylinders of the cover slide act as converging lenses which concentrate the incident light 14 on the exposed surface of the solar cell 10 and away form the grid lines 11. An additional advantage of the cover slide structure as illustrated in FIG. 1 is illustrated by the light ray 15. Because of the multiple reflection which occurs between the individual hemi-cylinders, surface reflection is reduced thereby increasing the light transmitted into the solar cell 10. A modification of the hemi-cylinder construction is a "waffle" lens wherein each lensette is generally hemispherical in shape but terminates in a square base rather than a circular base. In the case of a "waffle" lens, FIG. 1 is a cross-sectional view taken along either of two perpendicular directions. An advantage of this lens structure is the greater flexibility in the grid structure permitting cross-connecting of grids to increase reliability and decrease the distance carriers would have to travel in the surface region of the solar cell 10.

Figure 2:
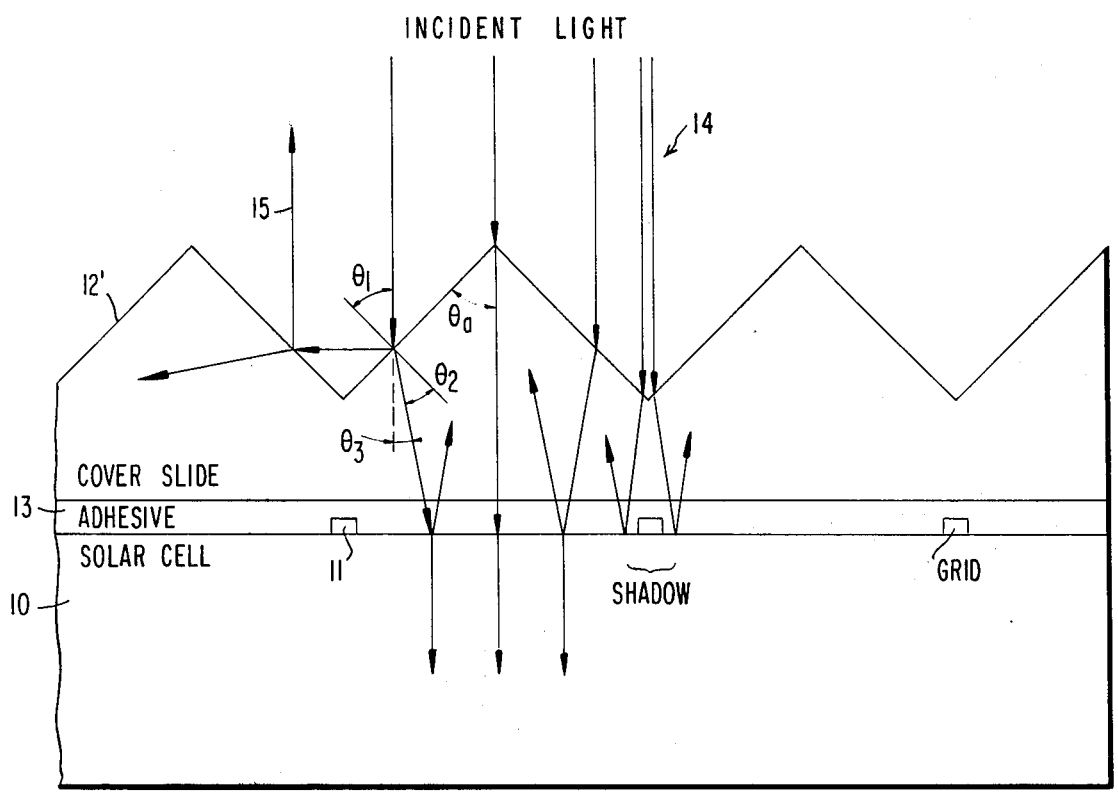
FIG. 2 is a cross-sectional view of a second embodiment of the cover slide according to the invention placed directly on top of a solar cell.

FIG. 2 shows an alternate construction of the cover slide according to the invention which has the advantage of facilitating the construction of the cover slide. In this embodiment, the cover slide 12' has a grooved surface having a generally sawtooth cross-sectional geometry. The size of the sawtooth would be determined by the number of grid lines 11 with the period between teeth corresponding to the period between the grid lines. Refraction at the surface of the cover slide bends the light on either side of the sawtooth into the center of the sawtooth. If the lowest points of the sawtooth are in registry with the grid lines 11, the grid lines will be shadowed. The shadow will exist under the lowest points of the sawtooth for a whole set of cover slide thickness, but another set exists which will give shadows under the peaks as well. An angle of $\theta_a$ approximately equal to 45° is the maximum half angle of the apex angle of the sawtooth for assuring that all normally incident light is reflected twice. Decreasing $\theta_a$ will allow this double reflection of off-normal incident light, which is important for body mounted arrays. The increase in $\theta_3$, with decreasing $\theta_a$ does not improve the optical coupling with the standard solar cell. In general, the use of a sawtooth rather than a lens, will reduce the reflection from the surface of the cover and consequently give more light to the surface of the solar cell. However, the light is not as highly concentrated as with a lens and will not increase the injection level to the same extent.

A modification of the sawtooth geometry illustrated in FIG. 2 is a square pyrimidal surface produced by a second set of grooves intersecting the first set of grooves at right angles thereto. This modification enjoys the same advantages enumerated for the "waffle" lens above. In the case of the square pyrimidal surface, FIG. 2 is a cross-sectional view taken in either of two perpendicular directions.

While the invention has been disclosed in combination with a conventional solar cell illustrated as having a planar or smooth surface, it will be understood by those skilled in the art that solar cells having non-smooth surfaces will also benefit from the use of the light concentrating cover slide of the invention. When non-smooth surface solar cells are considered, the cover slide surface can be optimized for maximum transmission and radiation resistance. It will therefore be apparent that the embodiments shown are only exemplary and that various modifications can be made in construction and arrangement within the scope of the invention as defined in the appended claims.

I claim:

1. In the combination of a single solar cell and a cover slide covering the surface of the solar cell which is exposed to incident light, said solar cell being of the type having a plurality of fine opaque grid lines which comprise the top electrode of said surface which is exposed to incident light, the improvement wherein said cover slide for said single solar cell consists of a plurality of converging lens means for concentrating incident light on the exposed surface areas of the solar cell between the grid lines, the repeat period of said converging lens means being equal to the distance between said grid lines.

2. A light concentrating solar cell cover slide as recited in claim 1 wherein said plurality of lens means comprise a plurality of hemi-cylinders.

3. A light concentrating solar cell cover slide as recited in claim 1 wherein said plurality of lens means is a "waffle" lens composed of a plurality of lensettes, each lensette having a generally hemispherical shape but terminating in a square base.

4. A light concentrating solar cell cover slide as recited in claim 1 wherein said plurality of lens means have a generally sawtooth configuration.

5. A light concentrating solar cell cover slide as recited in claim 1 wherein said plurality of lens means are a plurality of lensettes, each lensette having a square pyrimidal configuration.

* * * * *